United States Patent [19]

Hayashi

[11] Patent Number: 5,157,623
[45] Date of Patent: Oct. 20, 1992

[54] DIGITAL FILTER WITH DYNAMICALLY VARIABLE FILTER CHARACTERISTICS

[75] Inventor: Ryutaro Hayashi, Tachikawa, Japan

[73] Assignee: Casio Computer Co., Ltd., Tokyo, Japan

[21] Appl. No.: 628,572

[22] Filed: Dec. 17, 1990

[30] Foreign Application Priority Data

Dec. 30, 1989 [JP] Japan .................................. 1-341503
Dec. 30, 1989 [JP] Japan .................................. 1-341505

[51] Int. Cl.⁵ ............................................ G06F 15/31
[52] U.S. Cl. ........................... 364/724.17; 364/724.1; 84/DIG. 9
[58] Field of Search ....................... 364/724.17, 724.1; 84/DIG. 9

[56] References Cited

U.S. PATENT DOCUMENTS

| | | | |
|---|---|---|---|
| 4,422,156 | 12/1983 | Sano | 364/724.17 |
| 4,467,440 | 8/1984 | Sano et al. | 364/724.17 |
| 4,489,391 | 12/1984 | Morikawa | 364/724.17 |
| 4,738,179 | 4/1988 | Hideo | 84/DIG. 9 |
| 4,907,484 | 3/1990 | Suzuki et al. | 364/724.1 |

FOREIGN PATENT DOCUMENTS

63-36573 7/1983 Japan .
63-239494 5/1988 Japan .

Primary Examiner—David H. Malzahn
Attorney, Agent, or Firm—Frishauf, Holtz, Goodman & Woodward

[57] ABSTRACT

Filter coefficients corresponding to a plurality of discrete cutoff frequencies are stored in advance in a memory and a filter coefficient corresponding to a specified cutoff frequency is generated by performing an interpolation referring to the filter coefficients stored in the memory, thereby saving the capacity of the memory. When a resonance index is to be specified in addition to the cutoff frequency, filter coefficients corresponding to two difference resonance indexes are acquired by the interpolation, then a new filter coefficient is acquired by executing the interpolation referring to these two filter coefficients.

21 Claims, 19 Drawing Sheets

$b1 = 2(A^2-1)/(A^2+2aA+1)$
$b2 = (A^2-2aA+1)/(A^2+2aA+1)$
$K = (1+b1+b2)/4$

WHERE  $a = \cos 45°$
$A = \tan(fc\pi/fs)$
fc: CUTOFF FREQUENCY
fs: SAMPLING FREQUENCY

| | | | |
|---|---|---|---|
| ↓ 00000000 | = | - 3 | dB |
| 0001 | = | - 2.5 | dB |
| 0010 | = | - 2.0 | |
| 0011 | = | - 1.5 | |
| 0100 | = | - 1.0 | |
| 0101 | = | - 0.5 | |
| 0110 | = | ± 0.0 | |
| 0111 | = | + 0.5 | |
| 1000 | = | + 1.0 | |
| 1001 | = | + 1.5 | |
| 1010 | = | + 2.0 | |
| 1011 | = | + 2.5 | |
| 1100 | = | + 3.0 | |
| 1101 | = | + 3.5 | |
| 1110 | = | + 4.0 | |
| 1111 | = | + 4.5 | |
| 00010000 ↑ | = | + 5.0 | dB |

FIG. 15

FIG. 16 (RS=45DEGREES)

FIG.17 (RS=74DEGREES)

FIG.18 (RS=1DEGREE)

DIGITAL FILTER WITH DYNAMICALLY VARIABLE FILTER CHARACTERISTICS

BACKGROUND OF THE INVENTION

1. Field of the Invention

The present invention relates to a digital filter device which performs a digital filtering process.

2. Description of the Related Art

In applying a digital filter to an electronic musical instrument or the like, it is desirable that the filter characteristic can be dynamically changed. A cutoff frequency is a parameter that indicates the boundary between the frequency passing region and the frequency cutting region of a filter. Altering the cutoff frequency of the filter can change the tone quality and timbre of sounds produced by an electronic musical instrument. It is possible to directly compute individual coefficients (filter coefficients) of a transmittance (transfer function) of a digital filter from the cutoff frequency. However, this computation needs calculation of trigonometric functions, etc., thus requiring a considerable amount of time. The computation of the filter coefficients inevitably puts a great load on a control device (CPU) which should perform other processing. As a solution to this shortcoming, therefore, a conventional system includes a memory (filter coefficient conversion table) to store filter coefficients corresponding to the individual cutoff frequencies, and accesses this conversion memory with a specific cutoff frequency to thereby acquire the corresponding filter coefficient. The memory should, however, have a large memory capacity to store the filter coefficients for all the specific values of the cutoff frequency.

In applying a digital filter to processing musical tones, it is desirable that the resonance index as well as the cutoff frequency in the filter characteristic can variably be controlled. If the aforementioned conversion memory is used to acquire a filter coefficient from variable, specific values of the cutoff frequency and resonance index, the required memory capacity would become significantly large in proportion to (the total number of the cutoff frequencies)×(the total number of resonance indexes).

SUMMARY OF THE INVENTION

It is therefore the primary object of the present invention to provide a digital filter device capable of generating filter coefficients corresponding to given values of the cutoff frequency while saving or reducing the required memory capacity.

To achieve this object, according to one aspect of the present invention, there is provided a digital filter device comprising:

filter coefficient storage means for storing filter coefficients corresponding to a plurality of discretely set cutoff frequencies;

cutoff frequency specifying means for specifying a cutoff frequency;

first designation means for designating that one of the filter coefficients stored in the filter coefficient storage means which corresponds to a cutoff frequency closest to, but lower than, the cutoff frequency specified by the cutoff frequency specifying means;

second designation means for designating that one of the filter coefficients stored in the filter coefficient storage means which corresponds to a cutoff frequency closest to, but higher than, the cutoff frequency specified by the cutoff frequency specifying means;

filter coefficient calculating means for calculating a filter coefficient corresponding to the cutoff frequency specified by the cutoff frequency specifying means based on two filter coefficients respectively designated by the first and second designation means; and filtering means for filtering an input signal in accordance with the filter coefficient from the filter coefficient calculating means.

With the above arrangement, the memory capacity of the filter coefficient storage means can be saved or reduced, and a desired filter coefficient can be acquired in a shorter period of time compared with a case of computing the filter coefficient directly from the cutoff frequency.

It is another object of the present invention to provide a digital filter device capable of quickly and accurately computing a filter coefficient corresponding to a specific value of a given cutoff frequency while saving or reducing the required memory capacity.

To achieve this object, according to one aspect of the present invention, there is provided a digital filter device comprising:

filter coefficient storage means for storing filter coefficients corresponding to a plurality of discretely set cutoff frequencies, in order of level from a lower cutoff frequency to a higher one;

cutoff frequency specifying means for specifying a cutoff frequency;

conversion means for converting the cutoff frequency specified by the cutoff frequency specifying means into digital data consisting of multiple bits;

read means for reading out from the filter coefficient storage means those filter coefficients which correspond to a cutoff frequency closest to, but higher than, the cutoff frequency specified by the cutoff frequency specifying means, and a cutoff frequency closest to, but lower than, the specified cutoff frequency, based on the digital data from the conversion means;

calculating means for calculating a filter coefficient corresponding to the cutoff frequency specified by the cutoff frequency specifying means based on the two filter coefficients read out from the read mean and the digital data from the conversion means;

detection means for detecting whether or not the cutoff frequency specified by the cutoff frequency specifying means coincides with one of those cutoff frequencies which correspond to the filter coefficients stored in the filter coefficient storage means;

switching means for receiving the filter coefficient from the calculating means and the filter coefficient from the filter coefficient storage means, and outputting the filter coefficient from the filter coefficient storage means upon reception of a signal indicating frequency coincidence from the detection means and outputting the filter coefficient from the calculating means upon reception of a signal indicating non-coincidence from the detection means; and filtering means for filtering an input signal in accordance with the filter coefficient from the switching means.

With the above arrangement, when the specified cutoff frequency coincides with the cutoff frequency of a filter coefficient stored in the filter coefficient storage means, this filter coefficient is used as it is, thus preventing inaccurate filter coefficients from being generated due to a computation error.

It is a different object of the present invention to provide a digital filter device capable of generating the desired filter coefficient corresponding to a specific value of a given cutoff frequency with a fewer hardware structures while saving the required memory capacity.

To achieve this object, according to one aspect of the present invention, there is provided a digital filter device comprising:

filter coefficient storage means for storing filter coefficients corresponding to a plurality of discretely set cutoff frequencies;

cutoff frequency specifying means for specifying a cutoff frequency;

filter coefficient interpolation means for acquiring a filter coefficient corresponding to the cutoff frequency specified by the cutoff frequency specifying means using an interpolation method referring to those two filter coefficients stored in the filter coefficient storage means which correspond to those cutoff frequencies closest to, but higher than, and closest to, but lower than, the cutoff frequency specified by the cutoff frequency specifying means; and filtering means for filtering an input signal in accordance with the filter coefficient from the filter coefficient interpolation means.

With this arrangement, the desired filter coefficient can be acquired from the specified cutoff frequency in a shorter period of time with a fewer hardware structures, and the memory capacity of the filter coefficient storage means can be saved or reduced.

It is a further object of the present invention to provide a digital filter device capable of computing a filter coefficient based on the specified values of a variable cutoff frequency and a variable resonance index at a high speed, while saving the required memory capacity.

To achieve this object, according to one aspect of the present invention, there is provided a digital filter device comprising:

cutoff frequency specifying means for variably specifying a cutoff frequency;

resonance index specifying means for variably specifying a resonance index;

first filter coefficient storage means for storing a filter coefficient to give a filter characteristic based on a first resonance index to each of a plurality of discretely set, cutoff frequencies;

second filter coefficient storage means for storing a filter coefficient to give a filter characteristic based on a second resonance index to each of a plurality of discretely set cutoff frequencies;

first interpolation means for acquiring a filter coefficient to give a filter characteristic based on the first resonance index in accordance with the cutoff frequency specified by the cutoff frequency specifying means, using an interpolation method based on the filter coefficients stored in the first filter coefficient storage means;

second interpolation means for acquiring a filter coefficient to give a filter characteristic based on the second resonance index in accordance with the cutoff frequency specified by the cutoff frequency specifying means, using an interpolation method based on the filter coefficients stored in the second filter coefficient storage means;

third interpolation means for acquiring a filter coefficient corresponding to the resonance index specified by the resonance index specifying means, using an interpolation method referring to an output of the first interpolation means and an output of the second interpolation means; and filtering means for filtering an input signal in accordance with the filter coefficient from the third interpolation means.

With this arrangement, in accordance with a specified value of the cutoff frequency, two filter coefficients to two resonance indexes are respectively acquired referring to the filter coefficient storage means, then that filter coefficient which corresponds to the specified resonance index is acquired by an interpolation method using the obtained two filter coefficients. This can considerably reduce the memory capacity of the digital filter device and can ensure a high-speed filter control following up the inputting of the specified values of the variable cutoff frequency and resonance index.

It is a still further object of the present invention to provide a digital filter device capable of computing a filter coefficient based on the specified values of a variable cutoff frequency and a variable resonance index at a high speed with a fewer hardware structures, while saving the required memory capacity.

To achieve this object, according to one aspect of the present invention, there is provided a digital filter device comprising:

cutoff frequency specifying means for variably specifying a cutoff frequency;

resonance index specifying means for variably specifying a resonance index;

first filter coefficient storage means for storing a filter coefficient to give a filter characteristic based on a first resonance index to each of a plurality of discretely set cutoff frequencies;

second filter coefficient storage means for storing a filter coefficient to give a filter characteristic based on a second resonance index to each of a plurality of discretely set cutoff frequencies;

control means for executing a first interpolation process for acquiring a filter coefficient to give a filter characteristic based on the first resonance index in accordance with the cutoff frequency specified by the cutoff frequency specifying means, using an interpolation method based on the filter coefficients stored in the first filter coefficient storage means, a second interpolation process for acquiring a filter coefficient to give a filter characteristic based on the second resonance index in accordance with the cutoff frequency specified by the cutoff frequency specifying means, using an interpolation method based on the filter coefficients stored in the second filter coefficient storage means, and a third interpolation process for acquiring a filter coefficient corresponding to the resonance index specified by the resonance index specifying means, using an interpolation method referring to an output of the first interpolation means and an output of the second interpolation means; and filtering means for filtering an input signal in accordance with the filter coefficient from the control means.

With the above arrangement it is possible to acquire a filter coefficient to the specified resonance index with a fewer hardware structures, and considerably reduce the memory capacity of the digital filter device. Further, this arrangement can ensure a high-speed filter control following up the inputting of the specified values of the variable cutoff frequency and resonance index.

Additional objects and advantages of the invention will be set forth in the description which follows, and in part will be obvious from the description, or may be learned by practice of the invention. The objects an advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 15 is a diagram illustrating the correlation between input resonance index data and resonance indexes;

DETAILED DESCRIPTION OF THE PREFERRED EMBODIMENTS

Preferred embodiments of the present invention will be described below referring to the accompanying drawings.

Figure 1:
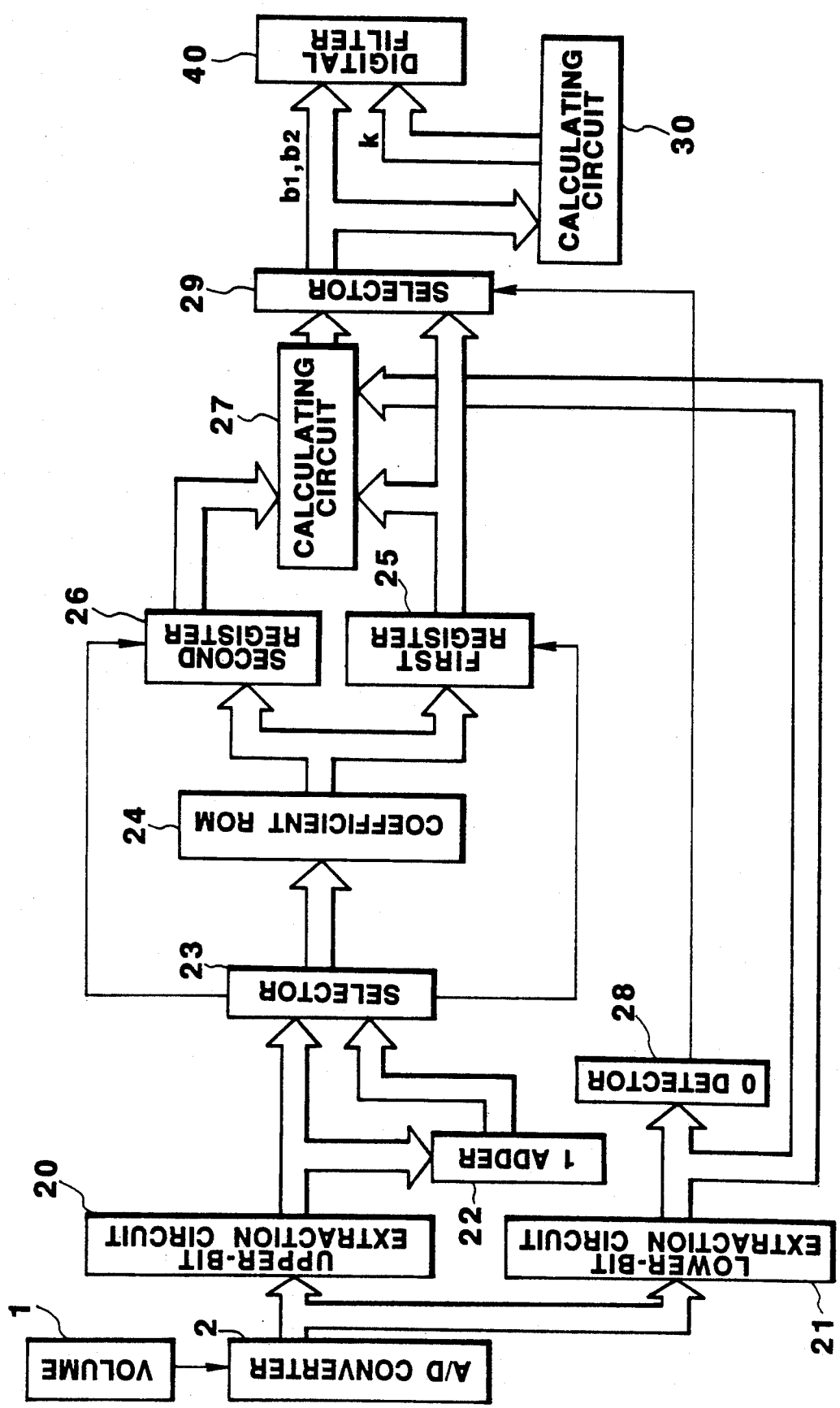
FIG. 1 is a block diagram illustrating the function of the first embodiment of the present invention.

FIG. 1 presents a block diagram showing the first embodiment of the present invention. A volume 1 serving as a cutoff frequency specifying device generates an analog voltage signal indicating a cutoff frequency of a digital filter 40. The cutoff indicating signal from the volume 1 is converted into a digital signal by an A/D converter 2.

A filter coefficient interpolation section (including blocks 20 to 30 performs interpolation referring to filter coefficients corresponding to a plurality of cutoff frequencies to generate a filter coefficient corresponding to the cutoff frequency indicated by the output of the A/D converter 2.

The structure and operation of the filter coefficient interpolation section will be described in detail below. The upper bits (address integer portion) of the output of the A/D converter 2 (specified cutoff frequency) are extracted by an upper-bit extraction circuit 20, and the lower bits (address fraction portion) are extracted by a lower-bit extraction circuit 21. The output of the upper-bit extraction circuit 20 is incremented by "1" in a "+1" adder 22.

The output of this extraction circuit 20 and the output of the "+1" adder 22 are input to a selector 23. The selector 23 multiplexes both inputs to address a coefficient ROM 24. The output of coefficient ROM 24 is supplied to a first register 25 and a second register 26. When addressing the coefficient ROM 2 by the output of the extraction circuit 20 (the integer portion of the specified cutoff frequency), the selector 23 permits the first register 25 to hold filter coefficient data corresponding to the integer portion of the target cutoff frequency output from the coefficient ROM 24. When addressing the coefficient ROM 24 by the output of the "+1" adder 22, the selector 23 permits the second register 26 to hold filter coefficient data corresponding to a sum of 1 and the integer portion of the target cutoff frequency output from the coefficient ROM 24.

The output of the first register 25 and the output of the second register 26 are sent to a calculating circuit 27. Data of the fraction portion of the specified cutoff frequency from the lower-bit extraction circuit 21 is also input to the calculating circuit 27. The calculating circuit 27 computes a filter coefficient corresponding to the specified cutoff frequency by a linear interpolation method using these inputs. The output of the calculating circuit 27 is selected by a selector 29 when a "0" detector 28 detects that a fraction portion is included in the target cutoff frequency. When the fraction portion of the target cutoff frequency is zero, the output of the first register 25 is selected by the selector 29. Accordingly, the filter coefficient output from the selector 29 does not have a calculation error.

A calculating circuit 30 calculates the remaining filter coefficients (indicated by "K") from the output of the selector 29 (indicated as filter coefficients b1 and b2).

Although the output of the calculating circuit 27 or the output of the first register 25 is selected by the selector 29 according to this embodiment, the structure may be modified so that the calculation is stopped by the output of the "0" detector 28 without using the selector 29. If the calculating circuit 27 is so designed as to output the value in the first register 25 as it is when the fraction portion is zero, the selector 29 and "0" detector 28 can be omitted.

The filter coefficient acquired in the above manner is sent to the digital filter 40. Based on the filter coefficient, the digital filter 40 performs a filtering process.

According to this embodiment, with filter coefficients corresponding to a limited number of discrete cutoff frequencies stored in the coefficient ROM, a filter coefficient corresponding to an arbitrary cutoff frequency specified by the volume 1 through the A/D converter 2 can be acquired by an interpolation method.

Figure 2:
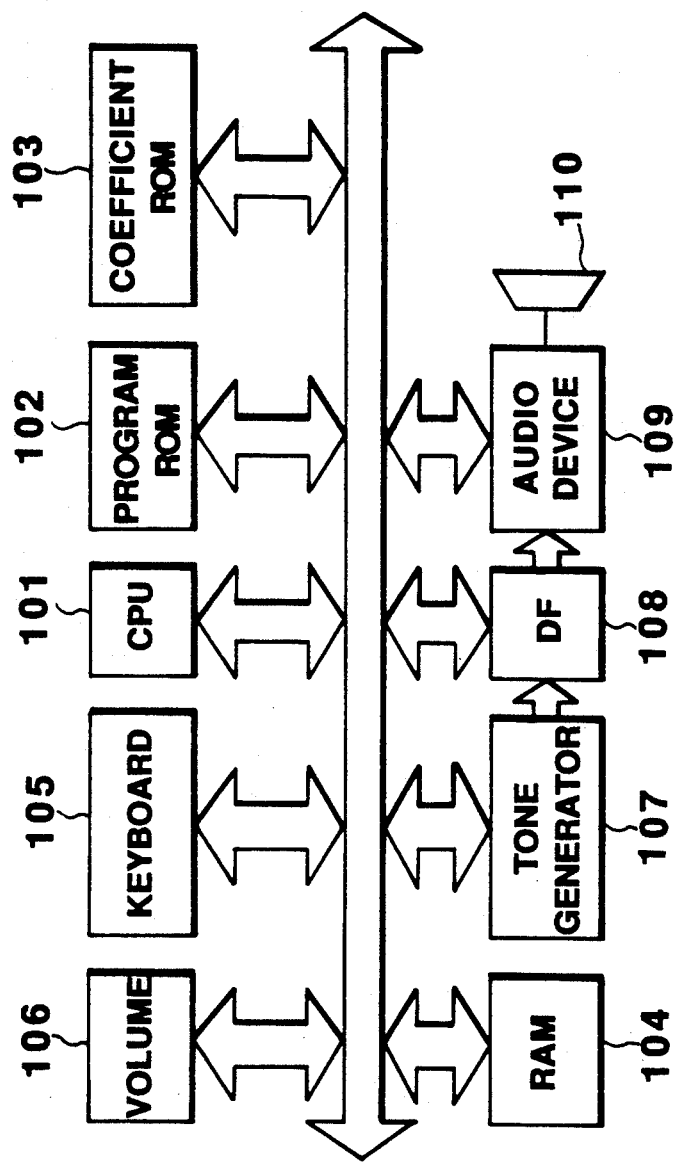
FIG. 2 is a hardware block diagram of the second embodiment of a digital filter device of the present invention as applied to an electronic musical instrument.

FIG. 2 is a hardware block diagram of an electronic musical instrument according to the second embodiment of the present invention. The general control of the apparatus is executed by a CPU 101. A program ROM 102 stores a program to be executed by the CPU 101. A coefficient ROM 103 stores filter coefficients corresponding to a plurality of discrete cutoff frequencies. A RAM 104 serves as a work memory for the CPU 101. A playing input is given through a keyboard 105. A volume 106 serves to input an instruction to change the cutoff frequency of a digital filter. A tone generator 107 produces musical tone signals. The produced tone signals are filtered by a digital filter (DF) 108 and are released as sounds through an audio device 109 and a loudspeaker 110.

Figure 3:
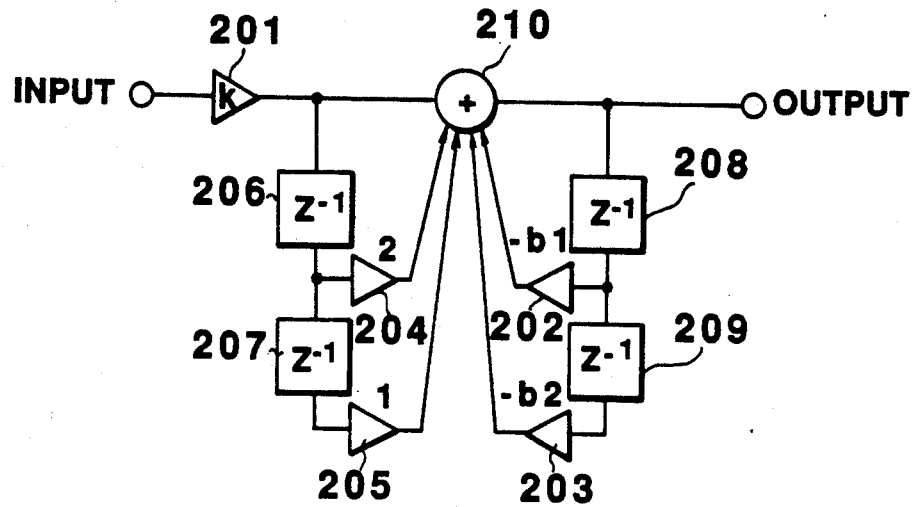
FIG. 3 is a block diagram of a secondary IIR filter usable as the digital filter shown in FIG. 2.

FIG. 3 presents a virtual arithmetic operation block diagram in a case where a secondary IIR filter is used as an example of the digital filter 108. Referring to the diagram, reference numerals 201 to 205 denote coefficient multipliers which multiply an input signal by a coefficient, reference numerals 206 to 209 denote delay elements which delay an input signal by one sample period, and reference numeral 210 is an adder. A coefficient K of the coefficient multiplier 201 which multiplies the input signal "input" by the coefficient, a coefficient b1 of the first feedback multiplier 202, and a coefficient b2 of the secondary feedback multiplier 203 depend on the cutoff frequency. More specifically, as shown in FIG. 3, the coefficients b1, b2 and K are given by:

$$b1 = 2(A^2 - 1)/(A^2 + 2aA + 1)$$

$$b2 = (A^2 - 2aA + 1)/(A^2 + 2aA + 1)$$

$$K = (1 + b1 + b2)/4$$

where a, A, fc and fs to the Butterworth low-pass filter are:
 a = cos 45°
 A = tan (fc$\pi$/fs)
 fc = cutoff frequency
 fs = sampling frequency.

A transfer function H(z) showing the relation between the input signal "input" of the filter and the output signal "output" is given by:

$$H(z) = \frac{K(1 + 2z^{-1} + z^{-2})}{1 + b1z^{-1} + b2z^{-2}}.$$

Figure 4:
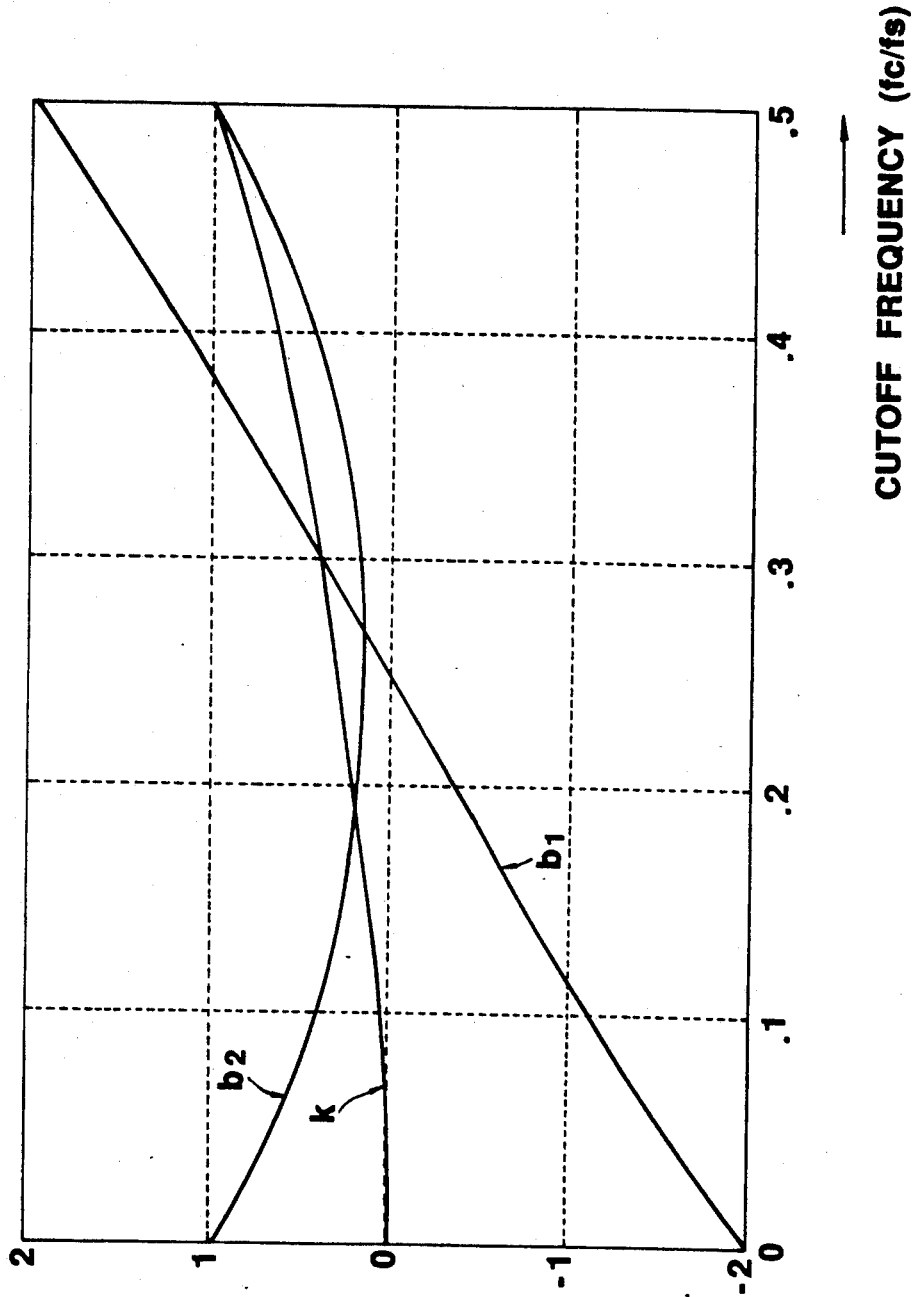
FIG. 4 is a diagram showing a dependence characteristic of the filter coefficient to the cutoff frequency.

FIG. 4 illustrates the relation between the filter coefficient and the cutoff frequency with fc/fs ranging from 0 to 0.5. If these coefficients b1, b2 and K are prepared for every cutoff frequency specified by the volume 106, the capacity of the coefficient ROM 103 becomes significant large. According to this embodiment, therefore, only the filter coefficients corresponding to discrete cutoff frequencies are stored in the coefficient ROM 103. Those filter coefficients corresponding to the intermediate cutoff frequencies of the discrete cutoff frequencies are acquired by an interpolation method. Since the coefficient K can easily be computed using the coefficients b1 and b2, only the coefficients b1 and b2 are stored in the coefficient ROM 103.

Figure 5:
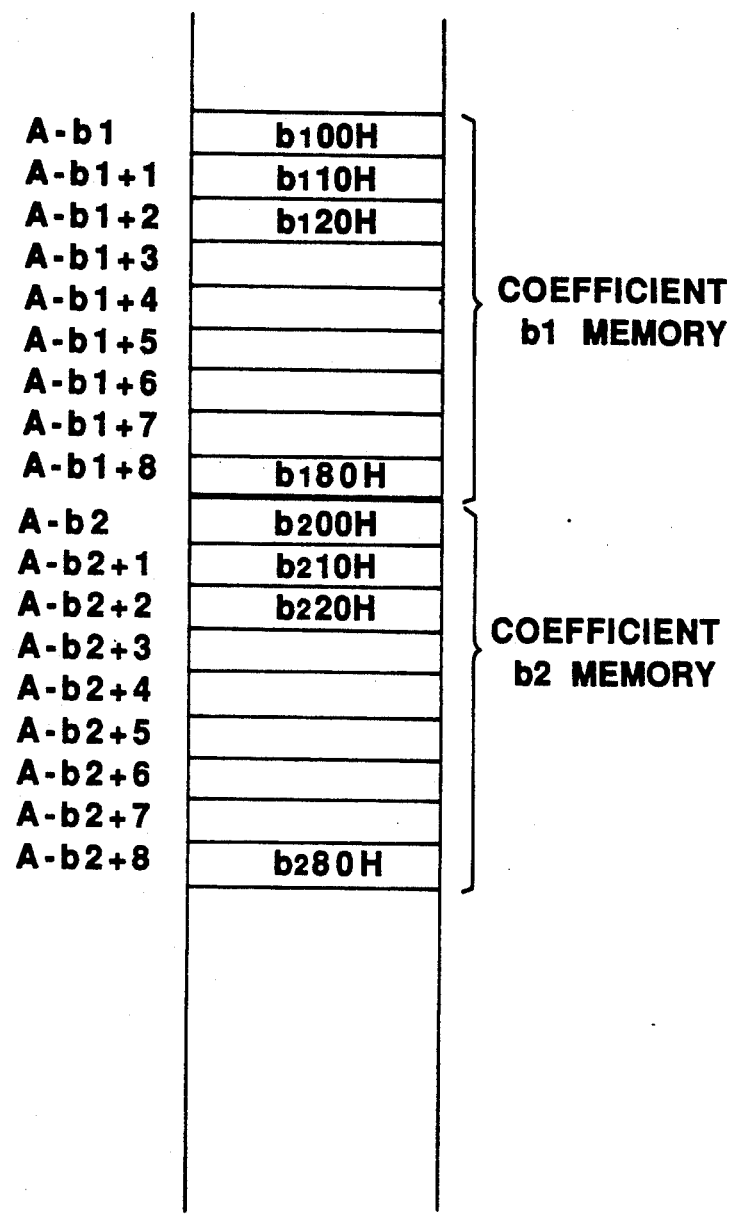
FIG. 5 is a diagram exemplifying the memory map of a coefficient ROM shown in FIG. 1.

FIG. 5 illustrates a memory map of the coefficient ROM 103 in a case where nine sample points of the cutoff frequency fc are taken. (A−b1) indicates the head address of a coefficient b1 memory, and (A−b2) the head address of a coefficient b2 memory. Given that the number of bits of an A/D converter (not shown in FIG. 2) which performs A/D conversion on the output of the volume 106 is "8," the total number of cutoff frequencies which can be specified is "129," and individual specific cutoff frequencies are between 0 to 128, those filter coefficients which correspond to the cutoff frequencies with a pitch sixteen times the minimum pitch of the specific values output from the A/D converter are stored at adjoining address in the coefficient ROM 103 (in the case of nine samples). In FIG. 5, numerals affixed to individual coefficients indicate the sample positions of the cutoff frequency in hexadecimal notation. For instance, b10H represents a coefficient for a specified value of the cutoff frequency of 10 H. The upper four bits of the 8-bit specified cutoff frequency given through the A/D converter from the volume 106 are considered to indicate a relative address of each coefficient memory as an address integer portion, while the lower four bits are considered to indicate an address fraction portion.

Figure 6:
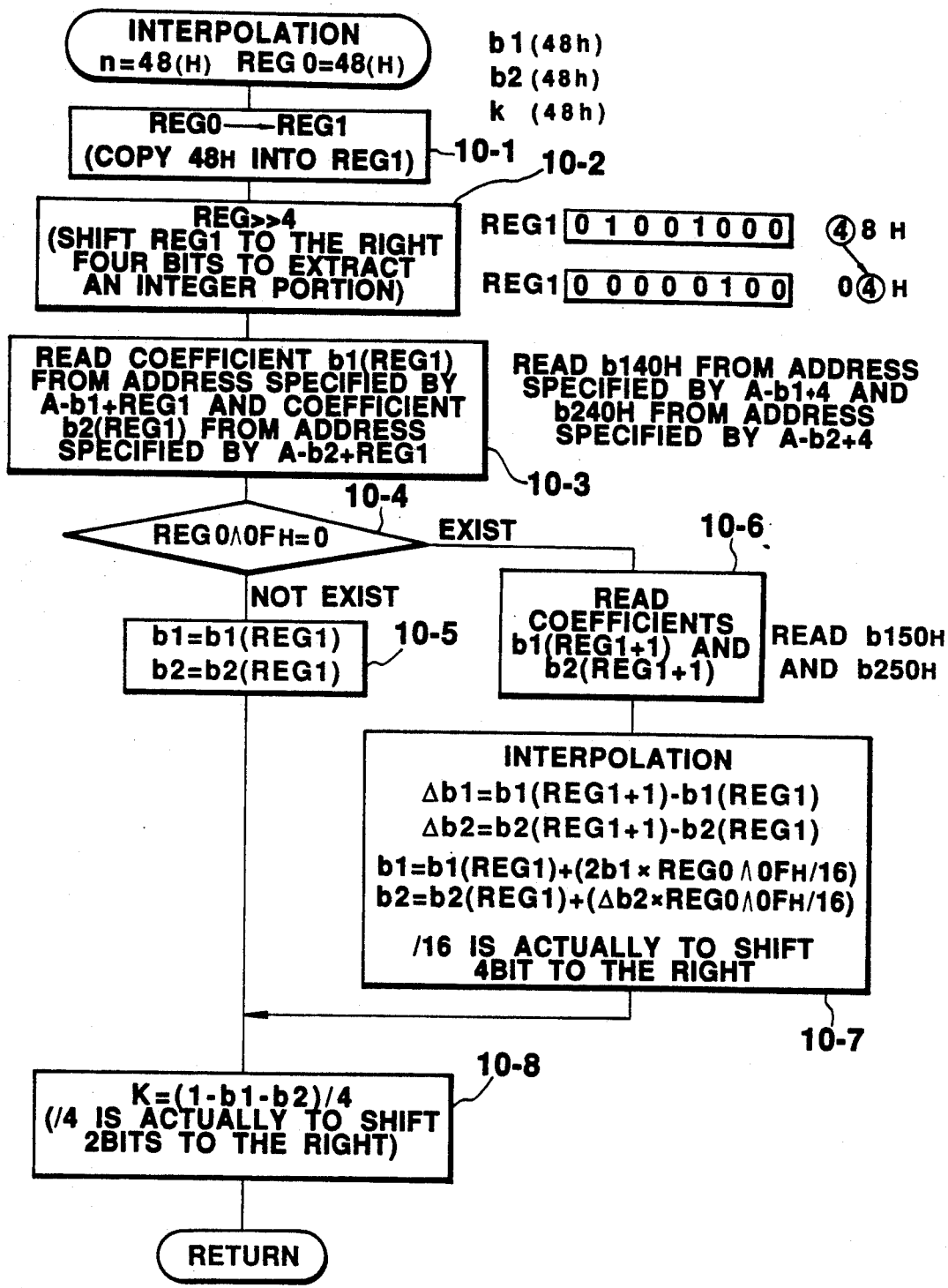
FIG. 6 is a flowchart illustrating a filter coefficient interpolation process executed by a CPU in FIG. 1.

FIG. 6 illustrates a flow of filter coefficient interpolation executed by the CPU 101. In this processing, a filter coefficient for the cutoff frequency specified by the volume 106 is interpolated referring to the coefficient ROM 103.

First, in step 10-1 the CPU 101 copies the specified cutoff frequency from the volume 106, which is set in a register Reg0 in the CPU 101, to a register Reg1 therein. In the next step 10-2, the CPU 101 shifts the content of the register Reg1 by four bits to the right. As a result, when the specified cutoff frequency is 48 H, for example, "04 H" would be obtained. The value resulting from the shifting operation represents the integer portion of the specified cutoff frequency, and indicates a relative address for each coefficient memory in the coefficient ROM 103. Then, in step 10-3 the CPU 101 reads out a coefficient stored at the address indicated by the head address (A−b1)+REG1 in the b1 coefficient memory (the coefficient being hereinafter called "b1(Reg1)") and a coefficient stored at the address indicated by the head address (A−b2)+REG1 in the b2 coefficient memory (the coefficient being hereinafter called "b2(Reg1)"). The coefficients b1(Reg1) and b2(Reg1) are values of the coefficients b1 and b2 which give the cutoff frequencies indicated b the integer portion of the specified cutoff frequency. The CPU 101 then obtains a logical product of Reg0 and 0 FH to check if there is a fraction portion of the specified cutoff frequency (step 10-4). If there is no fraction portion, which means the specified cutoff frequency being an integer value, the coefficients b1(Reg1) and b2(Reg1) read out in step 10-3 are respectively stored in b1 and b2 registers, which store coefficients b1 and b2 corresponding to the specified cutoff frequency (step 10-5). If there is a fraction portion, the CPU 101 reads out coefficients b1(Reg1+1) and b2(Reg1+1) stored at the next address to the address indicated by the integer portion of the specified cutoff frequency (step 10-6). The CPU 101 acquires the differences Δb1 and Δb2 of adjoining filter coefficients read out from the individual coefficient memories from the following equation:

$$\Delta b1 = b1(Reg1+1) - b1(Reg1)$$

$$\Delta b2 = b2(Reg1+1) - b2(Reg1)$$

Further, in step 10-7 the CPU 101 acquires the coefficients b1 and b2 which give the cutoff frequency indicated by the specified cutoff frequency Reg0 using the differences Δb1 and Δb2 and the fraction portion of the specified cutoff frequency, (Reg0∩0FH), from the following equation:

$$b1 = b1(Reg1) + (\Delta b1 \times (Reg0 \cap FH)/16)$$

$$b2 = b2(Reg1) + (\Delta b2 \times (Reg0 \cap FH)/16)$$

Finally, the CPU 101 uses the coefficients b1 and b2 to compute the remaining coefficient K from the equation $K = (1 + b1 + b2)/4$ (step 10-8). The same result would be obtained if the processing is done in the sequence of step 10-3, to step 10-6 to step 10-7 to step 10-8 without executing the checking step 10-4.

Figure 7:
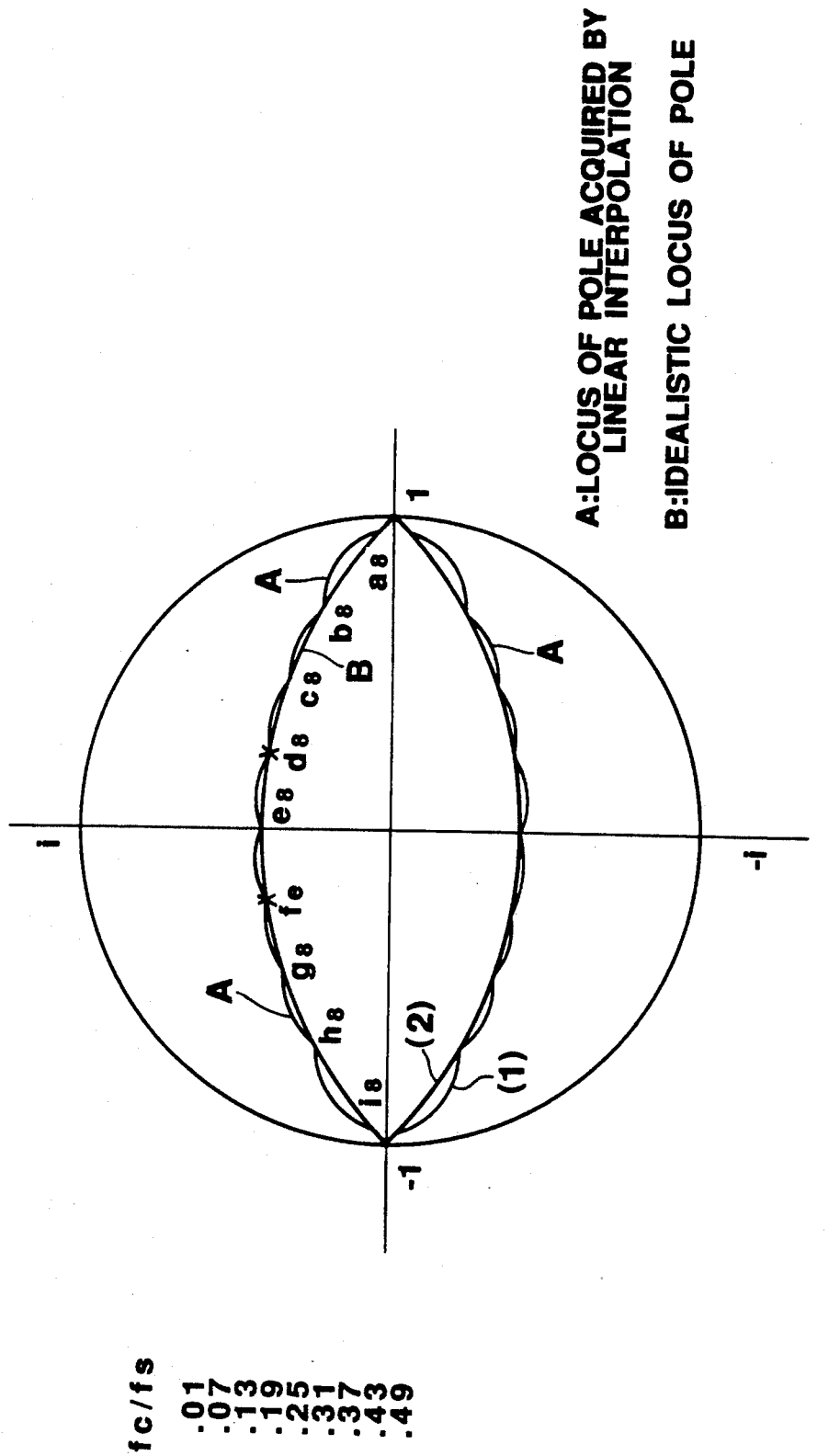
FIG. 7 is a diagram illustrating the idealistic locus of pole of a filter on the z plane and the locus of pole of a filter acquired through an interpolation process, with nine sampled filter coefficients.

FIGS. 7 through 10 are diagrams presented for evaluation of the interpolation processing shown in FIG. 6. FIG. 7 illustrates the locus of pole of the filter on the z plane. The curve B is an idealistic locus of pole acquired when the filter coefficients b1, b2 and K are directly calculated according to the equations given in FIG. 3, and in a case where the ratio of the cutoff frequency fc to the sampling frequency fs is in a range of 0.01 to 0.49. Points $a_8$ to $i_8$ indicate sample points of the cutoff frequency fc (the values of the filter coefficient are stored in the coefficient ROM 103), and the values of fc/fs of the individual sample points are as shown on the left side in FIG. 7. For instance, the value of fc/fs for the sample point $a_8$ is 0.01, the value of fc/fs for $b_8$ is 0.07, and the value of fc/fs for $i_8$ is 0.49. The curve A indicates the locus of pole acquired through linear interpolation between the individual sample points done according to the interpolation process shown in FIG. 6. Because of the linear interpolation, the resultant locus A extends outward from the idealistic locus B.

Figure 8:
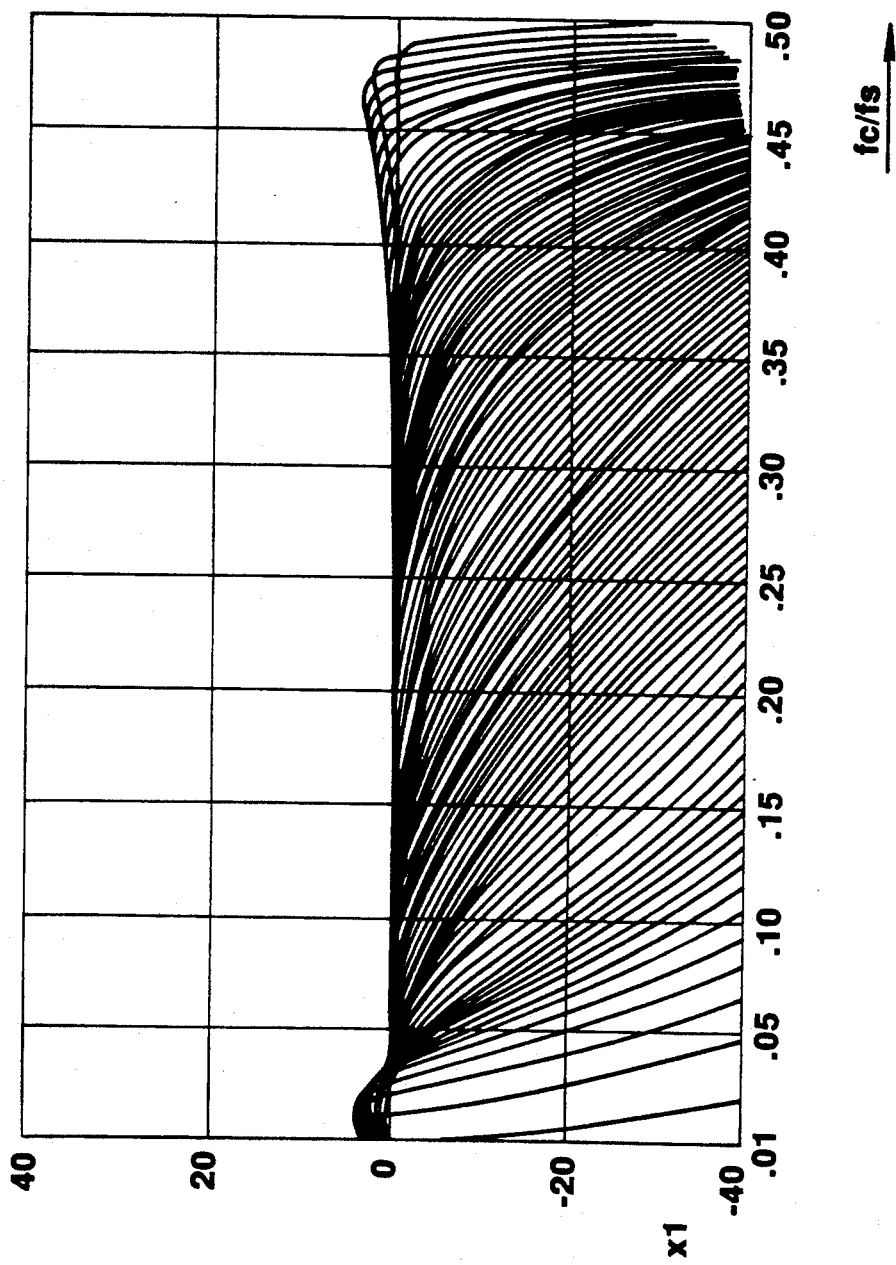
FIG. 8 illustrates a filter frequency response to the locus of the filter pole acquired through interpolation shown in FIG. 7.
Figure 9:
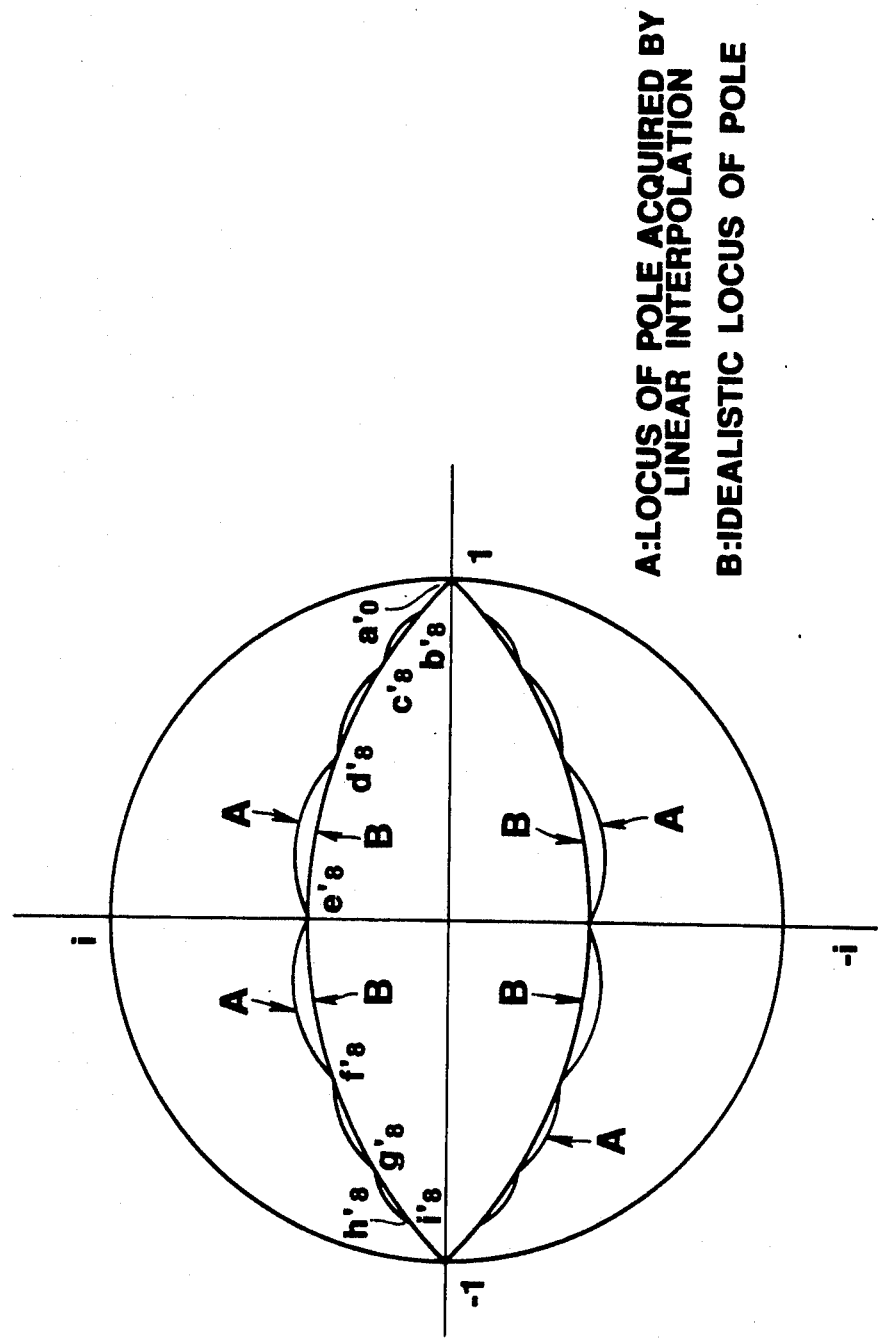
FIGS. 9 and 10 illustrate other loci of pole.
Figure 10:
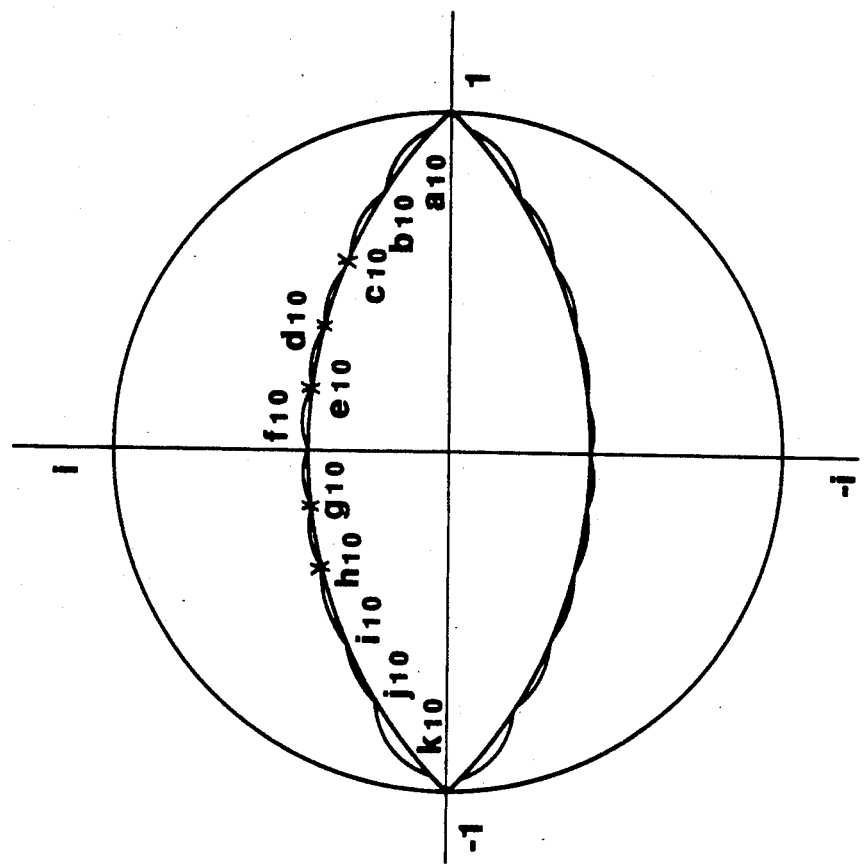

FIG. 8 illustrates the filter frequency response corresponding to the locus of pole A acquired by the interpolation method in a case involving nine sample points of the filter coefficient. It should be apparent from FIG. 8 that resonance has occurred when the cutoff frequency ratio fc/fs is in an intermediate region of 0.01-0.07 corresponding to the middle of the points $a_8$ and $b_8$ in FIG. 7 and in an intermediate region of 0.43-0.49 corresponding to the middle of the points $h_8$ and $i_8$ in FIG. 7. As shown in FIG. 7, the positions of the pole calculated by the interpolation method at these two portions are farthest from the positions of the idealistic pole. That is, the linear interpolation cause the locus of pole to extend outward from the idealistic locus of pole, and the deviation therebetween appears on the frequency response as the resonance. However, this error can be restricted to a practically negligible level by properly increasing the number of sample points. The nine sample points are taken only for the sake of diagrammatic convenience. For instance, if the difference of the cutoff frequency between adjoining sample points is set to about 100 cents, it is possible to perform a quite satisfactory interpolation from the point of audibility. FIGS. 9 and 10 illustrate loci of pole computed by the interpolation in a case where nine sample points are taken in a different manner than the one shown in FIG. 7, and in a case where eleven sample points are used, respectively. In FIG. 9 the closer to the unit circle, the denser the sample points, and the farther from the unit circle, the more coarse the sample points in light of the influence of the interpolation error on the filter characteristic becoming greater as the filter pole gets closer to the unit circle.

Information K, b1 and b2 of the filter coefficients acquired by the interpolation process in FIG. 6 are transferred to the digital filter 108. Based on the filter coefficients, the digital filter 108 filters a musical tone signal. As a result, filter control following up the cutoff frequency variably specified by the volume 106 is executed.

Figure 11:
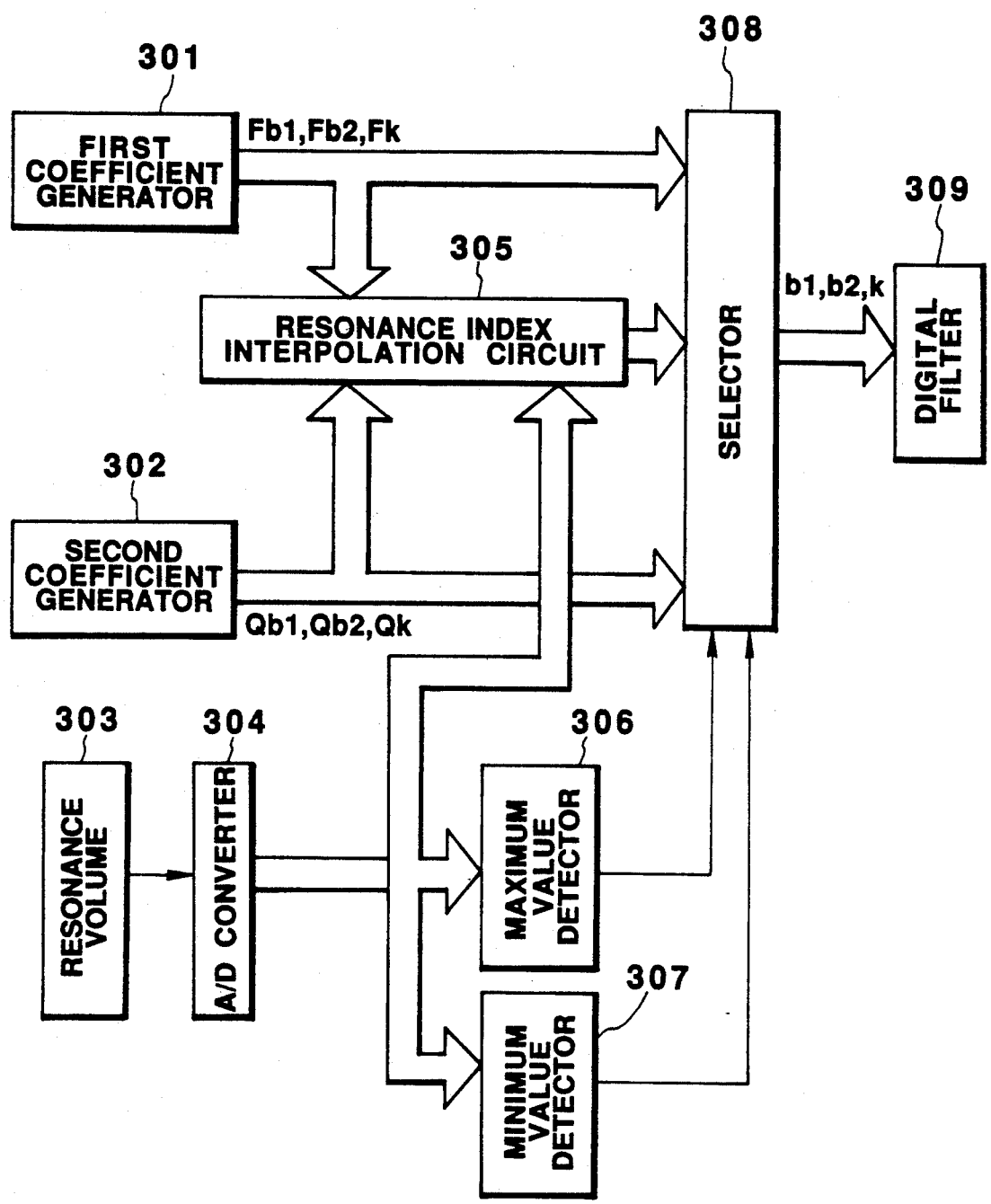
FIG. 11 is a block diagram illustrating the function of the third embodiment of the present invention.

FIG. 11 is a block diagram illustrating the function of a filter device according to the third embodiment of the present invention. Referring to this diagram, a first coefficient generator 301 and a second coefficient generator 302 generate filter coefficients corresponding to the specified cutoff frequency with respect to the minimum resonance index and the maximum resonance index, both specified by a volume 303, respectively. Both circuits have the same structure as the first embodiment as shown in FIG. 1 except that the content of the coefficient ROM 24 to be referred to by the circuit 301 differs from the memory content for the circuit 302. That is, filter coefficients for the minimum value of the resonance index specified by the resonance volume 303 are stored for the respective discrete cutoff frequencies in the coefficient ROM to which the first coefficient generator 301 refers. Filter coefficients for the maximum value of the resonance index specified by the resonance volume 303 are stored for the respective discrete cutoff frequencies in the coefficient.ROM to which the second coefficient generator 302 refers.

According, the first coefficient generator 301 generates filter coefficients (Fb1, Fb2 and FK in FIG. 11) for the minimum resonance index and corresponding to the cutoff frequency specified by the volume 303. The second coefficient generator 302 generates filter coefficients (Qb1, Qb2 and QK in FIG. 11) for the maximum resonance index and corresponding to the cutoff frequency specified by the volume 303. The outputs of these coefficient generators 301 and 302 are input to an interpolation circuit 305 for resonance compensation. Further, a resonance index specifying signal from the resonance volume 303, which specifies the resonance index, is also input to the interpolation circuit 305 via an A/D converter 304. The interpolation circuit 305 uses these inputs to compute the filter coefficient which gives the resonance index specified by the resonance volume 303 by the linear interpolation. The output of the interpolation circuit 305 and the outputs of the first and second coefficient generators 301 and 302 are sent to a selector 308, which serves to select the filter coefficients b1, b2 and K to be supplied to a digital filter 309. When a maximum value detector 306, which receives the output of the A/D converter 304, detects that the specified value of the resonance index is the largest, the selector 308 selects the outputs Qb1, Qb2 and K of the second coefficient generator 302 as filter coefficients b1, b2 and K to be sent to the digital filter 309. When a minimum value detector 307, which also receives the output of the A/D converter 304, detects that the specified value of the resonance index is the smallest, the selector 308 selects the output Fb1, Fb2 and FK of the first coefficient generator 301. Otherwise, the selector 308 selects the interpolated output of the interpolation circuit 305 as the filter coefficients b1, b2 and K to be sent to the digital filter 309. The digital filter 309 filters a signal to be processed, based on the received filter coefficients b1, b2 and K.

According to the third embodiment, as described above, the interpolation for the cutoff frequency and the interpolation for the resonance index are combined to effectively use the data from the coefficient ROM, thus achieving the significant reduction of the memory capacity. In FIG. 11, the elements 306, 307 and 308 are not essential. For instance, if a process to set the ratio of the output of the second coefficient generator (or first coefficient generator) to the interpolated output to 100% is executed when the resonance index is maximum (or minimum), the coefficients b1, b2 and K to be supplied to the digital filter 309 can be acquired from the output of the interpolation circuit 305 itself.

Figure 12:
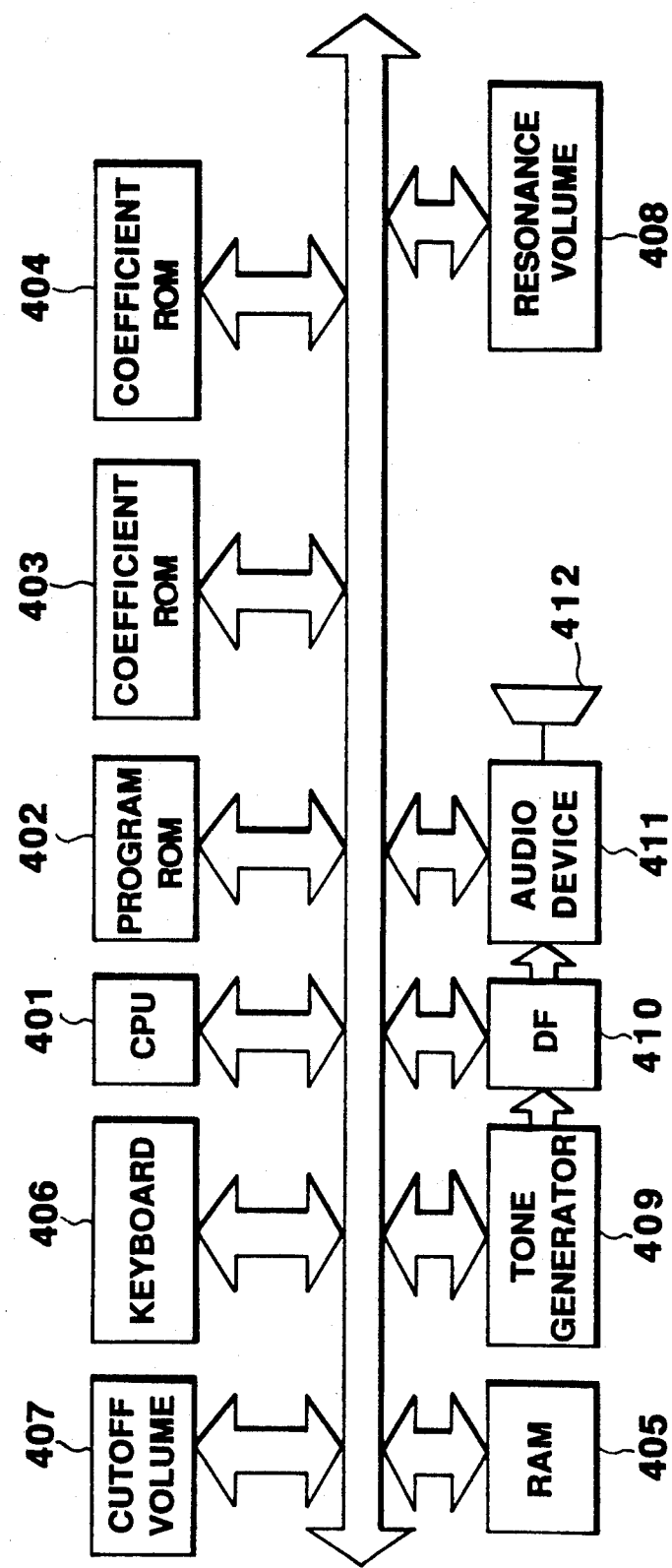
FIG. 12 is a hardware block diagram of the fourth embodiment of a digital filter device of the present invention as applied to a electronic musical instrument.

FIG. 12 is a general hardware block diagram of the fourth embodiment where the digital filter device of the present invention is applied to an electronic musical instrument. The general control of the apparatus is executed by a CPU 401. A program ROM 402 stores a program to be executed by the CPU 401. Coefficient ROMs 403 and 404 store filter coefficients corresponding to a plurality of discrete cutoff frequencies for different resonance indexes, respectively. A RAM 405 serves as a work memory for the CPU 401. A playing input is given through a keyboard 406. A volume 407 serves to input an instruction to specify the cutoff frequency of a digital filter. A volume 408 serves to input an instruction to change the resonance index of the digital filter. A tone generator 409 produces musical tone signals. The produced tone signals are filtered by a digital filter (DF) 410 and are released as sounds through an audio device 411 and a loudspeaker 412.

In a case where a secondary IIR filter is used as an example of the digital filter 410 shown in FIG. 3, a coefficient K of the coefficient multiplier 201 which multiplies the input signal "input" by the coefficient, a coefficient b1 of the first feedback multiplier 202, and a coefficient b2 of the secondary feedback multiplier 203 depend on the cutoff frequency and the resonance index. More specifically, the coefficients b1, b2 and K are given by the following equations:

$$b1 = 2(A^2 - 1)/(A^2 + 2aA + 1)$$

$$b2 = (A^2 - 2aA + 1)/(A^2 + 2aA + 1)$$

$$K = (1 + b1 + b2)/4$$

These equations are the same as those given in FIG. 3. In the above equations,
a = cos Rs
A = tan (fcπ/fs)
fc = cutoff frequency
fs = sampling frequency
Rs = resonance index.

As in the case of FIG. 3, a transfer function H(z) showing the relation between the input signal "input" of the filter and the output signal "output" is given by:

$$H(z) = \frac{K(1 + 2z^{-1} + z^{-2})}{1 + b1z^{-1} + b2z^{-2}}.$$

Figure 13:
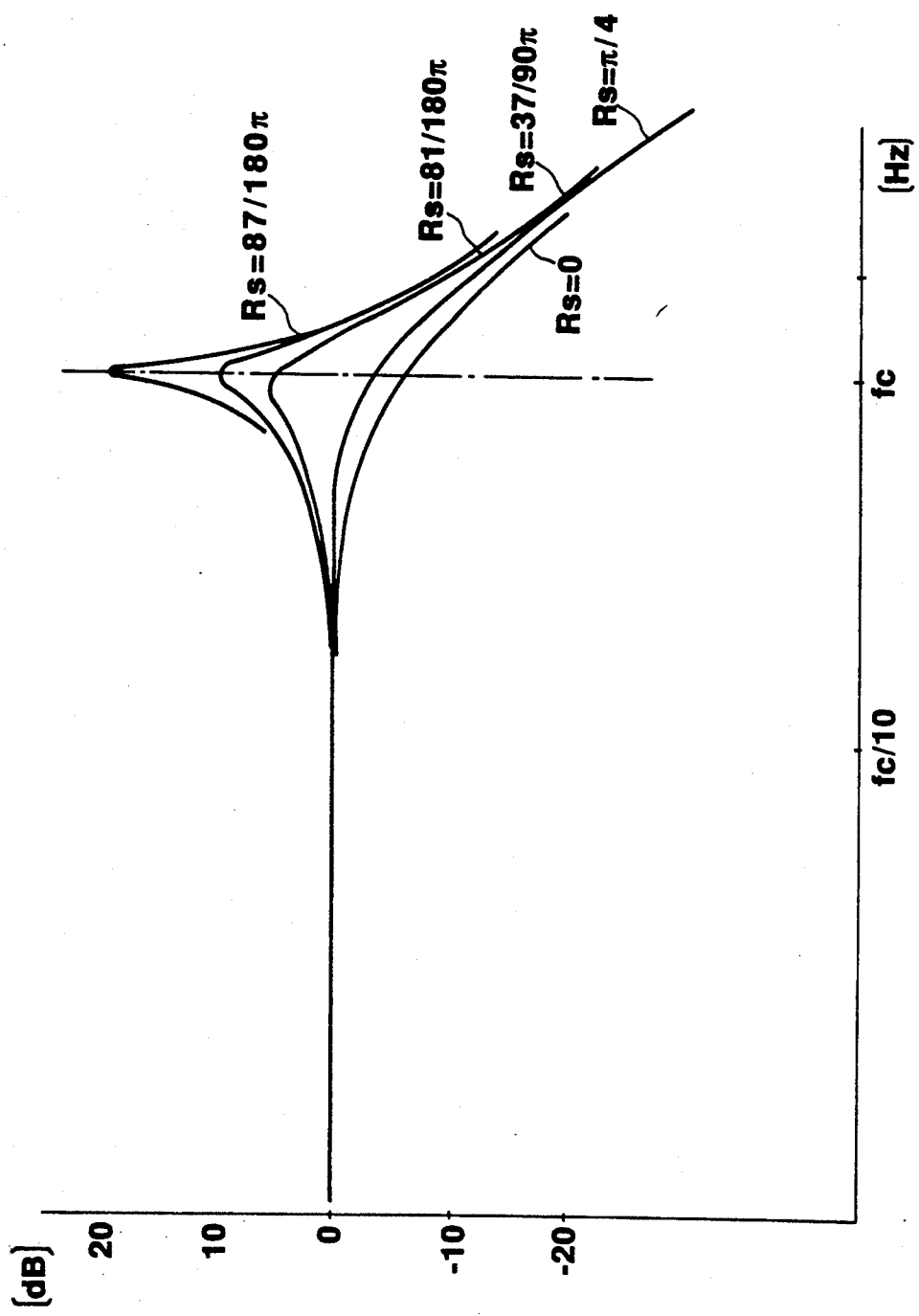
FIG. 13 shows a filter frequency response to different resonance indexes.

For reference, FIG. 13 illustrates the relation between the input-to-output ratio and the frequency with respect to different resonance indexes Rs.

Computing the coefficients b1, b2 and K directly from fc, Rs and sampling frequency fs acquired from FIG. 13 needs a considerable amount of time and is practically difficult to realize in an electronic musical instrument which requires real-time processing. To avoid this, it is necessary to use a coefficient memory which stores filter coefficients for possible cutoff frequencies and resonance indexes. This however requires a vast amount of memory capacity. According to this embodiment, therefore, only the filter coefficients corresponding to those discrete resonance indexes and cutoff frequencies which have wider pitches than the minimum pitches of the resonance index and cutoff frequency specifiable by the volumes 407 and 408 are stored in the coefficient ROMs 403 and 404. Those filter coefficients for other portion than the sample points are acquired by the interpolation process. Since the coefficient K can easily be computed from the coefficients b1 and b2 according to the above equation, it is not particularly prepared a storage data.

The coefficient ROMs 403 and 404 shown in FIG. 12 store filter coefficients for different cutoff frequencies with respect to a single resonance index. The memory map in this case is the same as that shown in FIG. 5.

Figure 14:
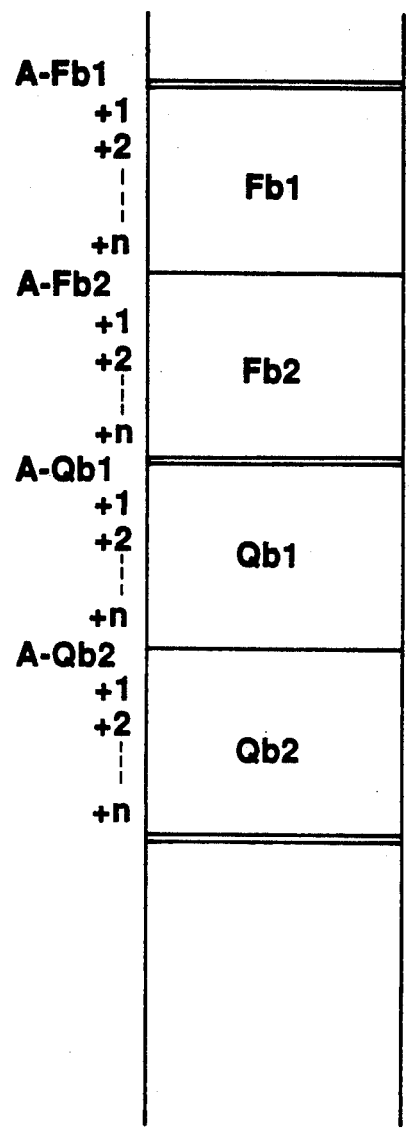
FIG. 14 is a diagram exemplifying the memory map of a coefficient ROM which provides two types of resonance indexes.

With only the coefficient ROMs for only one type of resonance index, the filter coefficient for a variable resonance index cannot be interpolated. The interpolation of a variable resonance index requires coefficient ROMs for two different resonance indexes at a minimum. The memory map for this case is exemplified in FIG. 14. In FIG. 14, Fb1 is a memory for storing a filter coefficient b1 corresponding to the first (minimum) resonance index for each cutoff frequency, and Fb2 is a memory for storing a filter coefficient b2 corresponding to the minimum resonance index for each cutoff frequency. Likewise, Qb1 and Qb2 denote memories for storing a filter coefficient b1 corresponding to the second (maximum) resonance index for each cutoff frequency. For instance, π/4 can be used as a value of the first resonance index, and 37 π/90 can be used as a value of the second resonance index. The first resonance index represents the maximum resonance value specifiable by the resonance volume 408, and the second resonance index the maximum resonance value specifiable by the resonance volume 408. Assume that the output of the resonance volume 408 (output after digitization) has effective 5 bits which can take a value from 0 to 16 (decimal notation). Through the resonance interpolation process to be described later, 17 stages of interpolation are possible. FIG. 15 presents a table showing the values of the resonance index (expressed in "dB" here) which are meant by the 5-bit output of the volume 408. For instance, the output of the volume 408, "00000" (binary) represents the resonance gain of −3 dB, while "10000" indicates the resonance gain of +5.0 dB. In this case, the resonance resolution of the volume is 0.5 dB. As shown in FIG. 13, when Rs=π/4, the relative gain (resonance gain) to the filter passing region at the cutoff frequency fc becomes approximately −3 dB, and when Rs=37π/90, the resonance gain becomes nearly +5 dB.

Figure 16:
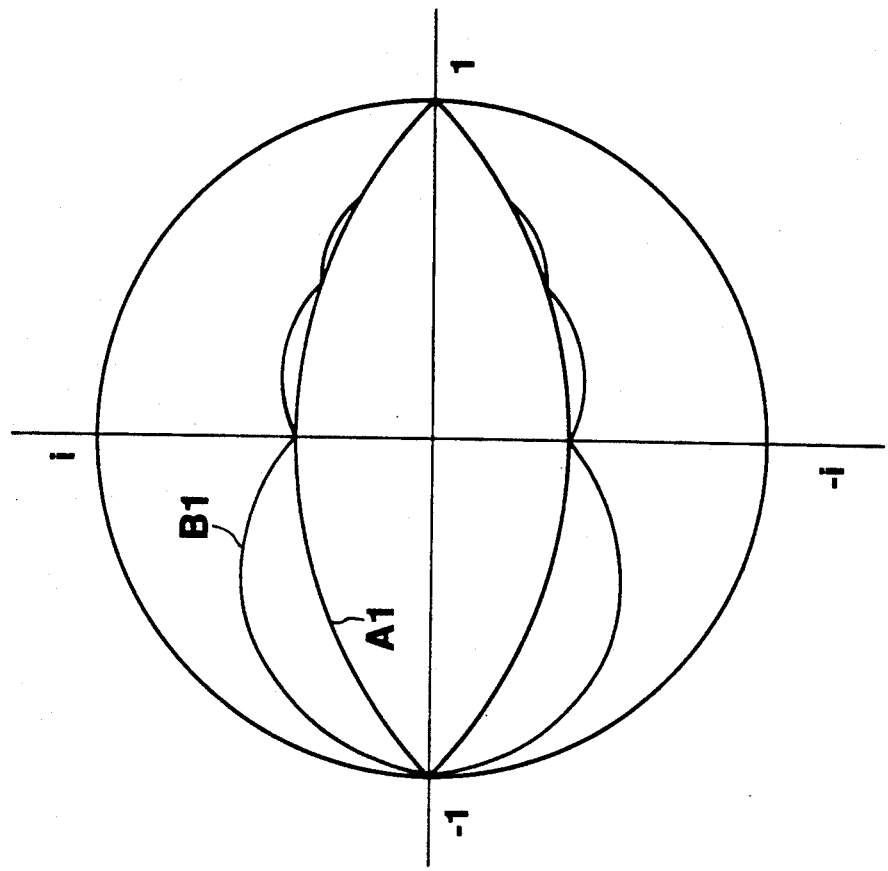
FIGS. 16, 17 and 18 illustrate the idealistic loci of pole of a filter with loci of pole acquired by interpolating the cutoff frequency.
Figure 17:
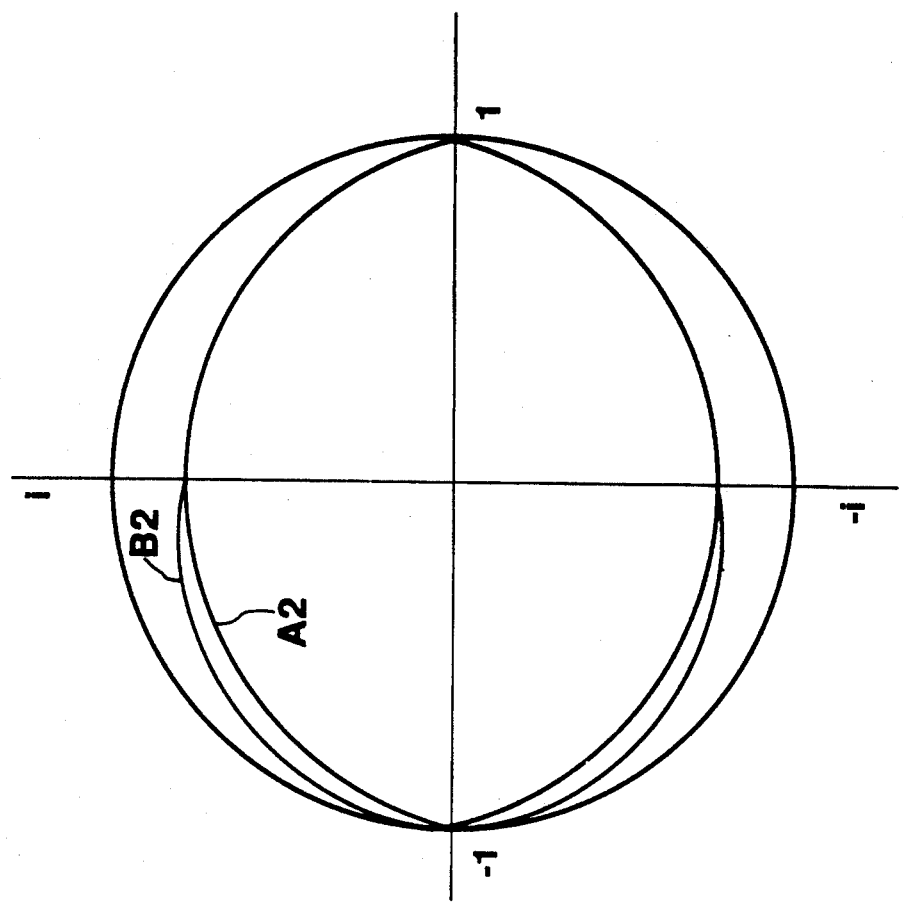
Figure 18:
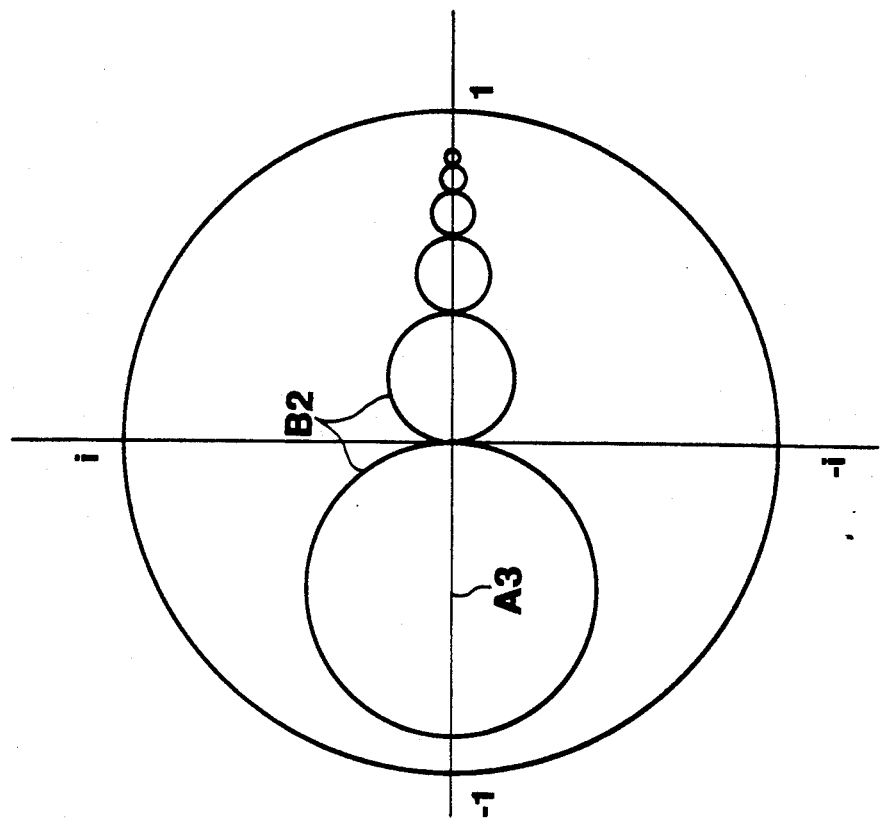

FIGS. 16 to 18 illustrate loci of pole of a filter having different resonance indexes with respect to a change in cutoff frequency. FIG. 16 is a diagram for the resonance index Rs=45 degrees, FIG. 17 is a diagram for Rs=74 degrees, and FIG. 18 is a diagram for Rs=1 degree. In these diagrams, curves A1, A2 and A3 are idealistic loci of pole acquired when the coefficients b1, b2 and K are directly obtained from the aforementioned equations. Curves B1, B2 and B3 are interpolated loci of pole acquired by the filter coefficients obtained by interpolating between the sample points, with the values given on the left in those diagrams taken as the sample points of the cutoff frequency ratio fc/fs.

Figure 19:
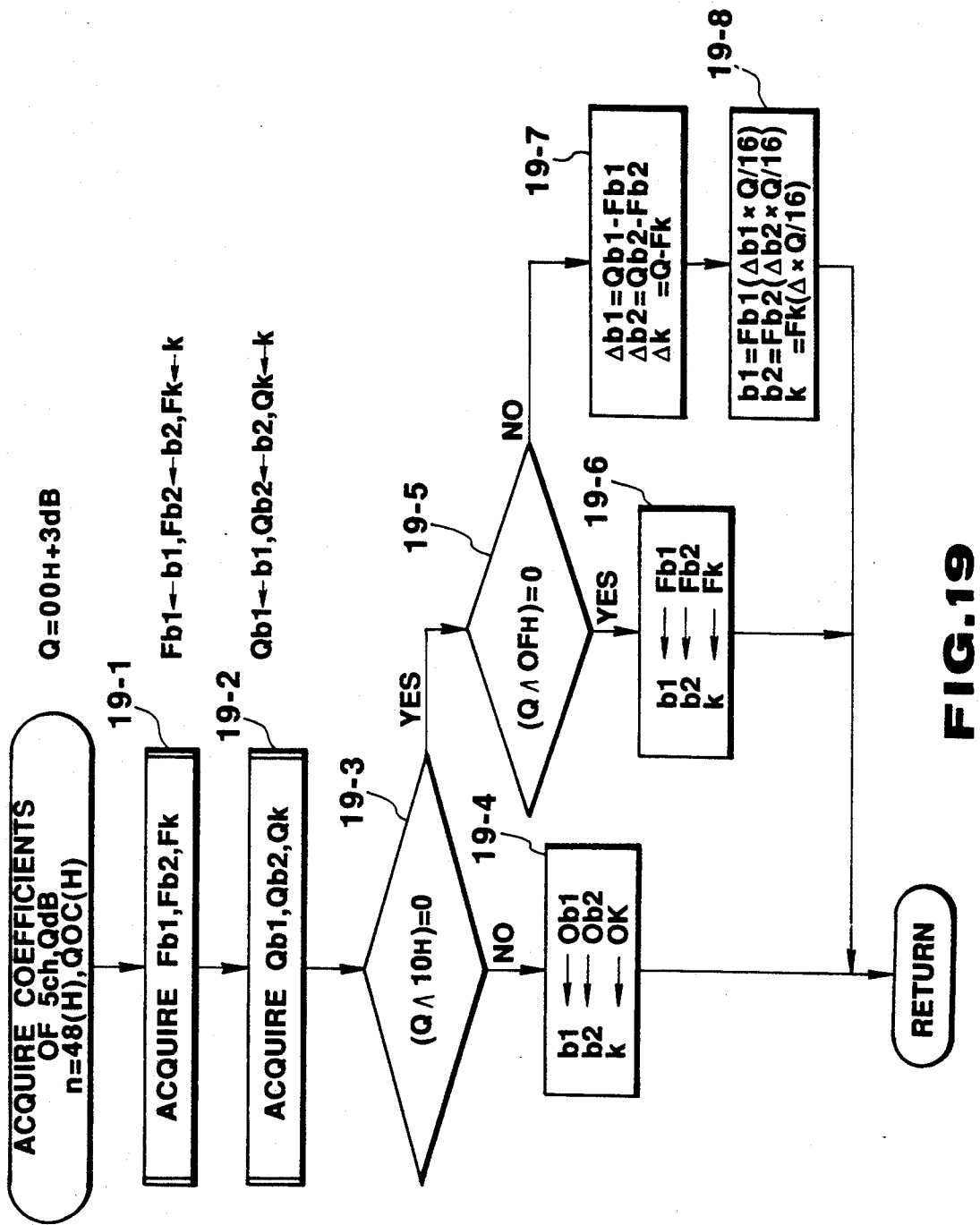
FIG. 19 is a flowchart illustrating a filter coefficient interpolation process executed by a CPU shown in FIG. 11.

FIG. 19 illustrates a sequence of processes to be executed by the CPU 401 in order to acquire filter coefficients corresponding to the cutoff frequencies specified by the volume 407 and the resonance indexes specified by the volume 408.

First, in step 19-1, that of the filter coefficients associated with the minimum resonance index which gives the cutoff frequency specified by the cutoff volume 408 is acquired by an interpolation method referring to the memories Fb1 and Fb2 shown in FIG. 14. In the next step 19-2, that of the filter coefficients associated with the maximum resonance index which gives the cutoff frequency specified by the cutoff volume 408 is acquired by the interpolation method referring to the memories Qb1 and Qb2 shown in FIG. 14. The processes of steps 19-1 and 19-2 are the same as the process shown in FIG. 6.

In step 19-1, the acquired coefficients b1, b2 and K are stored in the Fb1, Fb2 and FK registers. In step 19-2 the coefficients b1, b2 and K are stored in the Qb1, Qb2 and QK registers. This completes the interpolation for the cutoff frequency by which time the filter coefficients corresponding to specified cutoff frequency for the minimum resonance index ($-3$ dB) are held in the Fb1, Fb2 and FK registers and the filter coefficients corresponding to specified cutoff frequency for the maximum resonance index ($+5$ dB) are held in the Qb1, Qb2 and QK registers.

In the subsequent processing, an interpolation process for the resonance index will be executed. First, a logical product of the resonance index specified by the volume 408, held in the Q register, and 10H to check if the specified value Q indicates the maximum resonance value "+5 dB" (see FIG. 15) (step 19-3). If $Q \cap 10H = 0$ is not satisfied, which means that the filter coefficients corresponding to the resonance index are held in the Qb1, Qb2 and QK registers, these coefficients are copied into the b1, b2 and K registers (step 19-4). If $Q \cap 10H = 0$ is satisfied, the flow advances to step 19-5 where a logical product of the specified resonance index Q and 0FH to check if the specified value Q indicates the minimum resonance index ($-3$ dB). If $Q \cap 0FH = 0$ is satisfied, it means that specified value Q indicates the minimum resonance index. In this case, as the necessary filter coefficients are held in the Fb1, Fb2 and FK registers, the contents of the registers are copied into the b1, b2 and K registers (step 19-6). If the specified resonance index is neither the largest nor the smallest, the flow advances to step 19-7 where the differences between the filter coefficients for the maximum resonance index with the cutoff frequency interpolated and the filter coefficients for the minimum resonance index, $\Delta b1$, $\Delta b2$ and $\Delta K$ are calculated according to the following equations:

$$\Delta b1 = Qb1 - Fb1,$$

$$\Delta b2 = Qb2 - Fb2, \text{ and}$$

$$\Delta K = QK - FK.$$

In the next step 19-8, the filter coefficients for the specified resonance index are calculated by the interpolation method according to the following equations using the acquired differences $\Delta b1$, $\Delta b2$ and $\Delta K$, the value Q of the specified resonance index and the filter coefficients Fb1, Fb2 and FK:

$$b1 = Fb1 + (\Delta b1 \times Q/16),$$

$$b2 = Fb2 + (\Delta b2 \times Q/16), \text{ and}$$

$$K = FK + (\Delta K \times Q/16).$$

The obtained filter coefficients b1, b2 and K have filter coefficient values which give the cutoff frequency specified by the volume 407 and the resonance index specified by the volume 408. It is therefore possible to generate filter coefficients on the realtime base in accordance with the specified cutoff frequency given from the volume 407 and the specified resonance index given from the volume 408, while saving the memory capacities of the coefficient ROMs 402 and 403.

The present invention is not restricted to the above-described embodiments, but may be modified in various manners within the scope of the invention. For instance, filter coefficients for three or more discrete resonance indexes may be stored in the coefficient ROM according to the fourth embodiment. In this case, if the memory to be referred to in steps 19-1 and 19-2 for interpolating the cutoff frequency is selected in accordance with the upper bits of the specified resonance index (i.e., which memory to store the filter coefficient associated with the resonance index is determined by the upper bits of the specified resonance index), the processing would become more efficient. If data to be stored in the coefficient ROM is set to be the difference between coefficient values, not the coefficient values themselves, according to the first to fourth embodiments, the memory capacity would be further saved. The digital filter is not limited to a secondary IIR filter, but may be a digital filter of the proper order and type. The volume 106, 407 or 408, which is manually operated, may be replaced with a function (wave) generator which automatically generates a function whose value varies with time.

In the embodiments, the linear interpolation method is used an example. Other kinds of known interpolation method can be used.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A digital filter device comprising:
   filter coefficient storage means for storing filter coefficients corresponding to a plurality of discretely set cutoff frequencies, in order of level from a lower cutoff frequency to a higher one;
   cutoff frequency specifying means for specifying a cutoff frequency;
   conversion means for converting said cutoff frequency specified by said cutoff frequency specifying means into digital data consisting of multiple bits;
   read means for reading out from said filter coefficient storage means those filter coefficients which correspond to a cutoff frequency closest to, but higher than, said cutoff frequency specified by said cutoff frequency specifying means, and a cutoff frequency closest to, but lower than, said specified cutoff frequency, based on said digital data from said conversion means;

calculating means for calculating a filter coefficient corresponding to said cutoff frequency specified by said cutoff frequency specifying means based on said two filter coefficients read out from said read means and said digital data from said conversion means;

detection means for detecting whether or not said cutoff frequency specified by said cutoff frequency specifying means coincides with one of those cutoff frequencies which correspond to said filter coefficients stored in said filter coefficient storage means;

switching means for receiving said filter coefficient from said calculating mean and said filter coefficient from said filter coefficient storage means, and outputting said filter coefficient from said filter coefficient storage means upon reception of a coincidence signal indicating frequency coincidence from said detection means and outputting said filter coefficient from said calculating means upon reception of a non-coincidence signal indicating non-coincidence from said detection means; and filtering means for filtering an input signal in accordance with said filter coefficient from said switching means.

2. A digital filter device according to claim 1, wherein said read means includes upper bit extraction means for extracting an upper-bit output including a predetermined number of upper bits of digital data from said conversion means and adder means for adding "1" to an output of said upper bit extraction means, and reads out two filter coefficients from said filter coefficient storage means using outputs of said upper bit extraction means and said adder means as an address.

3. A digital filter device according to claim 1, wherein said detection means includes lower bit extraction means for extracting a lower-bit output including a predetermined number of lower bits of digital data from said conversion means and "0" detection means for outputting said coincidence signal when a lower-bit output from said lower bit extraction means is "0" and outputting said non-coincidence signal when said lower-bit output is not "0."

4. A digital filter device according to claim 3, wherein said lower-bit output from said lower bit extraction means is supplied to said calculating means.

5. A digital filter device according to claim 1, wherein upon reception of said coincidence signal from said detection means, said switching means outputs two filter coefficients read out from said filter coefficient storage means which corresponds to a lower cutoff frequency.

6. A digital filter device comprising:

filter coefficient storage means for storing filter coefficients corresponding to a plurality of discretely set cutoff frequencies;

cutoff frequency specifying means for specifying a cutoff frequency which is outputting as digital data having a plurality of bits;

filter coefficient interpolation means for executing (a) a process of temporarily storing digital data corresponding to said cutoff frequency from said cutoff frequency specifying means, (b) a process of shifting said stored digital data by a predetermined number of bits in a direction of lower bits, (c) a process of reading a first filter coefficient from said filter coefficient storage means based on said shifted digital data, (d) a process of extracting a lower-bit output consisting of a predetermined number of lower bits of said stored digital data and discriminating if said extracted lower-bit output is "0", (e) a process of outputting said read-out first filter coefficient when said lower-bit output is determined to be "0" in said discrimination process, and (f) a process of reading out a second filter coefficient from said filter coefficient storage means using said shifted digital data added by a predetermined value, calculating a third filter coefficient based on said first and second filter coefficients and said lower-bit output of said digital data and outputting said third filter coefficient when said lower-bit output is not determined to be "0"; and filtering means for filtering an input signal in accordance with whichever of said first and third filter coefficients is outputted from said filter coefficient interpolation means.

7. A digital filter device comprising:

cutoff frequency specifying means for variably specifying a cutoff frequency;

resonance index specifying means for variably specifying a resonance index;

first filter coefficient storage means for storing a filter coefficient to give a filter characteristic based on a first resonance index to each of a plurality of discretely set cutoff frequencies;

second filter coefficient storage means for storing a filter coefficient to give a filter characteristic based on a second resonance index to each of a plurality of discretely set cutoff frequencies;

first interpolation means for acquiring a filter coefficient to give a filter characteristic based on said first resonance index in accordance with said cutoff frequency specified by said cutoff frequency specifying means, using an interpolation method based on said filter coefficients stored in said first filter coefficient storage means;

second interpolation means for acquiring a filter coefficient to give a filter characteristic based on said second resonance index in accordance with said cutoff frequency specified by said cutoff frequency specifying means, using an interpolation method based on said filter coefficients stored in said second filter coefficient storage means;

third interpolation means for acquiring a filter coefficient corresponding to said resonance index specified by said resonance index specifying means, using an interpolation method referring to an output of said first interpolation means and an output of said second interpolation means; and filtering means for filtering an input signal in accordance with said filter coefficient from said third interpolation means.

8. A digital filter device according to claim 7, wherein said first interpolation means refers to two of said filter coefficients stored in said first filter coefficient storage means, corresponding to a cutoff frequency closest to, but higher than, said cutoff frequency specified by said cutoff frequency specifying means, and a cutoff frequency closest to, but lower than, said specified cutoff frequency, and interpolating said filter coefficients.

9. A digital filter device according to claim 8, wherein said first interpolation means includes conversion means for converting said cutoff frequency specified by said cutoff frequency specifying means into digital data consisting of a plurality of bits, upper bit extraction means for extracting an upper-bit output consisting of a predetermined number of upper bits of said digital data and adder means for adding a predetermined value to an output of said upper bit extraction means, and addresses said upper bit extraction means said adder means to read out two filter coefficients from said first filter coefficient storage means.

10. A digital filter device according to claim 9, wherein said first interpolation means further includes lower bit extraction means for extracting a lower-bit output consisting of a predetermined number of bits of said digital data from said conversion means, calculating means for performing a calculation for interpolation based on said lower-bit output extracted by said lower bit extraction means and said two filter coefficients read out from said first filter coefficient storage means, detection means for detecting whether or not said lower-bit output is "0," and switching means for outputting a filter coefficient corresponding to said low cutoff frequency read out from said first storage means when said lower-bit output is detected to be "0" by said detection means, and outputting a filter coefficient from said calculating means when said lower-bit output is not detected to be "0."

11. A digital filter device according to claim 10, wherein said filter calculating means calculates a filter coefficient C corresponding to said cutoff frequency specified by said cutoff frequency specifying means from a relation $$C = A + F \times (B - A)$$

where A is a filter coefficient corresponding to a low cutoff frequency, B is a filter coefficient corresponding to a high cutoff frequency, and F is said lower-bit output from said lower bit extraction means.

12. A digital filter device according to claim 7, wherein said first interpolation means refers to two of said filter coefficients stored in said first filter coefficient storage means, corresponding to a cutoff frequency closest to, but higher than, said cutoff frequency specified by said cutoff frequency specifying means, and a cutoff frequency closest to, but lower than, said specified cutoff frequency, and interpolating said filter coefficients.

13. A digital filter device according to claim 12, wherein said first interpolation means includes conversion means for converting said cutoff frequency specified by said cutoff frequency specifying means into digital data consisting of a plurality of bits, upper bit extraction means for extracting an upper-bit output consisting of a predetermined number of upper bits of said digital data and adder means for adding a predetermined value to an output of said upper bit extraction means, and addresses said upper bitextraction means said adder means to read out two filter coefficients from said first filter coefficient storage means.

14. A digital filter device according to claim 12, wherein said second interpolation means further includes lower bit extraction means for extracting a lower-bit output consisting of a predetermined number of bits of said digital data from said conversion means, calculating means for performing a calculation for interpolation based on said lower-bit output extracted by said lower bit extraction means and said two filter coefficients read out from said first filter coefficient storage means, detection means for detecting whether or not said lower-bit output is "0," and switching means for outputting a filter coefficient corresponding to said low cutoff frequency read out from said first storage means when said lower-bit output is detected to be "0" by said detection means, and outputting a filter coefficient from said calculating means when said lower-bit output is not detected to be "0."

15. A digital filter device according to claim 14, wherein said filter calculating means calculates a filter coefficient C corresponding to said cutoff frequency specified by said cutoff frequency specifying means from a relation $$C = A + F \times (B - A)$$

where A is a filter coefficient corresponding to a low cutoff frequency, B is a filter coefficient corresponding to a high cutoff frequency, and F is said lower-bit output from said lower bit extraction means.

16. A digital filter device according to claim 7, wherein said third interpolation means includes interpolation means for acquiring a filter coefficient corresponding to said resonance index specified by said resonance index specifying means by an interpolation method based on said filter coefficients from said first and second interpolation means and said specified resonance index, detection means for outputting a detection signal upon detection of said specified resonance index becoming a predetermined value, and switching means for normally outputting said filter coefficient said interpolation mean and outputting said filter coefficient from said first or second filter coefficient storage means when said detection signal is generated.

17. A digital filter device according to claim 16, wherein said first filter coefficient storage means stores filter coefficients corresponding to a settable minimum resonance index, said second filter coefficient storage means stores filter coefficients corresponding to a settable maximum resonance index, said switching means outputs said filter coefficient from said first filter coefficient storage means when said detection means detects that said minimum resonance index is specified by said resonance index specifying means and outputting said filter coefficient from said second filter coefficient storage means when said detection means detects that said maximum resonance index is specified.

18. A digital filter device comprising:
cutoff frequency specifying means for variably specifying a cutoff frequency;
resonance index specifying means for variably specifying a resonance index;
first filter coefficient storage means for storing a filter coefficient to give a filter characteristic based on a first resonance index to each of a plurality of discretely set cutoff frequencies;
second filter coefficient storage means for storing a filter coefficient to give a filter characteristic based on a second resonance index to each of a plurality of discretely set cutoff frequencies;
control means for executing a first interpolation process for acquiring a filter coefficient to give a filter characteristic based on said first resonance index in accordance with said cutoff frequency specified by said cutoff frequency specifying means, using an interpolation method based on said filter coefficients stored in said first filter coefficient storage means, a second interpolation process for acquiring a filter coefficient to give a filter characteristic based on said second resonance index in accordance with said cutoff frequency specified by said cutoff frequency specifying means, using an interpolation method based on said filter coefficients stored in said second filter coefficient storage means, and a third interpolation process for acquiring a filter coefficient corresponding to said resonance index specified by said resonance index specifying means, using an interpolation method referring to an output of said first interpolation means and an output of said second interpolation means; and filtering means for filtering an input signal in accordance with said filter coefficient from said control means.

19. A digital filter device according to claim 18, wherein said first interpolation process of said control means comprises a step of temporarily storing digital data corresponding to said cutoff frequency from said cutoff frequency specifying means, a step of shifting said stored digital data by a predetermined number of bits in a direction of lower bits, a step of reading a first filter coefficient from said first filter coefficient storage means based on said shifted digital data, a step of extracting a lower-bit output consisting of a predetermined number of lower bits of said stored digital data and discriminating if said extracted lower-bit output is "0," a step of outputting said read-out first filter coefficient when said lower-bit output is determined to be "0" in said discrimination step, and a step of reading out a second filter coefficient from said first filter coefficient storage means using said shifted digital data added by a predetermined value, and calculating a third filter coefficient based on said first and second filter coefficients and said lower-bit output of said digital data.

20. A digital filter device according to claim 18, wherein said second interpolation process of said control means comprises a step of temporarily storing digital data corresponding to said cutoff frequency from said cutoff frequency specifying means, a step of shifting said stored digital data by a predetermined number of bits in a direction of lower bits, a step of reading a third filter coefficient from said second filter coefficient storage means based on said shifted digital data, a step of extracting a lower-bit output consisting of a predetermined number of lower bits of said stored digital data and discriminating if said extracted lower-bit output is "0," a step of outputting said read-out third filter coefficient when said lower-bit output is determined to be "0" in said discrimination step, a step of reading out a fourth filter coefficient from said second filter coefficient storage means using said shifted digital data added by a predetermined value, and a step of calculating a fifth filter coefficient based on said third and fourth filter coefficients and said lower-bit output of said digital data.

21. A digital filter device according to claim 18, wherein said third interpolation process of said control means comprises a step of discriminating whether said resonance index specified by said resonance index specifying means indicates a settable maximum value or minimum value, a step of outputting said filter coefficient acquired by said second interpolation process to said filtering means when said specified resonance index indicates said maximum value, a step of outputting said filter coefficient acquired by said first interpolation process when said specified resonance index indicates said minimum value, and a step of calculating a new filter coefficient based on said filter coefficients acquired by said first and second interpolation processes and said specified resonance index.

* * * * *